United States Patent
Kim et al.

(10) Patent No.: US 7,659,215 B2
(45) Date of Patent: Feb. 9, 2010

(54) METHOD OF DEPOSITING NANOLAMINATE FILM FOR NON-VOLATILE FLOATING GATE MEMORY DEVICES BY ATOMIC LAYER DEPOSITION

(75) Inventors: Chang-Gyoun Kim, Daejeon (KR); Young-Kuk Lee, Daejeon (KR); Taek-Mo Chung, Daejeon (KR); Ki-Seok An, Daejeon (KR); Sun-Sook Lee, Daejeon (KR); Won-Tae Cho, Busan (KR)

(73) Assignee: Korea Research Institute of Chemical Technology, Daejeon (KR)

( * ) Notice: Subject to any disclaimer, the term of this patent is extended or adjusted under 35 U.S.C. 154(b) by 217 days.

(21) Appl. No.: 11/846,768

(22) Filed: Aug. 29, 2007

(65) Prior Publication Data

US 2008/0054332 A1    Mar. 6, 2008

(30) Foreign Application Priority Data

Aug. 30, 2006 (KR) .................. 10-2006-0083022

(51) Int. Cl.
| | |
|---|---|
| H01L 21/469 | (2006.01) |
| H01L 21/31 | (2006.01) |
| H01L 23/58 | (2006.01) |
| H01L 23/52 | (2006.01) |
| H01L 23/48 | (2006.01) |
| H01L 29/40 | (2006.01) |
| H01L 21/28 | (2006.01) |

(52) U.S. Cl. .................. 438/778; 438/785; 438/761; 257/635; 257/761; 257/766; 257/E21.179

(58) Field of Classification Search ............... 438/778, 438/785, 761; 257/635, 761, 766, E21.179
See application file for complete search history.

(56) References Cited

U.S. PATENT DOCUMENTS 7,220,669 B2 * 5/2007 Hujanen et al. ............. 438/650
2007/0018219 A1 * 1/2007 Lim et al. .................. 257/296

FOREIGN PATENT DOCUMENTS

KR    10-2005-0033737    4/2005

OTHER PUBLICATIONS

Mikko Utriainen, et al.; Studies of metallic thin film growth in an atomic layer epitaxy reactor using M(acac) (M = Ni Cu, Pt) precursors; Applied Surface Science, 157:151-158, 2000.
Sangmoo Choi et al.; Highly thermally stable TiN nanocrystals as charge trapping sites for nonvolatile memory device applications; Applied Physics Letter, 86:123110, 2005.

(Continued)

*Primary Examiner*—Luan C Thai
(74) *Attorney, Agent, or Firm*—H.C. Park & Associates, PLC

(57) ABSTRACT

Disclosed herein is a method of depositing a nanolaminate film for next-generation non-volatile floating gate memory devices by atomic layer deposition. The method includes the steps of: introducing a substrate into an atomic layer deposition reactor; forming on the substrate a first high-dielectric-constant layer by alternately supplying an oxygen source and a metal source selected from among an aluminum source, a zirconium source and a hafnium source; forming on the first high-dielectric-constant layer a nickel oxide layer by alternately supplying a nickel source and an oxygen source; and forming on the nickel oxide layer a second high-dielectric-constant layer by alternately supplying an oxygen source and a metal source selected from among an aluminum source, a zirconium source and a hafnium source. The nanolaminate film deposited according to the method shows good memory window characteristics compared to those of memory devices fabricated using nanocrystal floating gates according to the prior physical vapor deposition methods, and thus can be applied to non-volatile floating gate memory devices.

15 Claims, 4 Drawing Sheets

OTHER PUBLICATIONS

Nobuyoshi Takahashi et al.; Control of Coulomb blockade oscillations in silicon single electron transistors using silicon nanocrystal floating gates; Applied Physics Letter, 76:209, 2000.

Mikko Utriainen et al.; Studies of NiO thin film formation by atomic layer epitaxy. Materials Science and Engineering, B54:98, 1998.

M. Kanoun et al.; Electrical study of Ge-nanocrystal-based metal-oxide-semiconductor structures for p-type nonvolatile memory applications; Applied Physics Letter; 84:5079, 2004.

Shunji Nakata et al.; Nonvolatile memory using Al2O3 film with an embedded Al-rich layer; Applied Physics Letter; 87, 223110, 2005.

Shiye Wang et al.; Investigation of Ge nanocrytals in a metal-insulator-semiconductor structure with a HfO2 /SiO2 stack as the tunnel dielectric. Applied Physics Letter; 86:113105, 2005.

M. Leskela and M. Ritala, "ALD precursor chemistry: Evolution and future challenges", Journal de Physique IV France 9 (1999), pp. 837-852.

* cited by examiner

METHOD OF DEPOSITING NANOLAMINATE FILM FOR NON-VOLATILE FLOATING GATE MEMORY DEVICES BY ATOMIC LAYER DEPOSITION

CROSS-REFERENCE TO RELATED APPLICATION

This application claims priority from and the benefit of Korean Patent Application No. 10-2006-83022, filed on Aug. 30, 2006, which is hereby incorporated by reference for all purposes as if fully set forth herein.

BACKGROUND OF THE INVENTION

1. Field of the Invention

The present invention relates to a method for depositing a nanolaminate film consisting of first high-dielectric-constant layer/nickel oxide layer/second high-dielectric-constant layer, which is to be used in non-volatile floating gate memory devices, by atomic layer deposition (ALD), and to a non-volatile floating gate memory device comprising the same.

2. Description of the Prior Art

Memory devices, which have recently been increasingly used in mobile phones, MP3 players, digital cameras, USB devices, etc., are non-volatile memory devices that solve problems in the volatile operation mode of DRAM devices. As next-generation memory devices, non-volatile memory devices have received attention. The non-volatile memory devices include phase RAM (PRAM), polymer random access memory (PoRAM) devices, magnetic RAM (MRAM), and resistance RAM (RRAM), which use resistance switching or conductivity switching, as well as nano-floating gate memory (NFGM) devices.

Prior studies on non-volatile floating gate memory devices are broadly classified into two categories: the use of thin films, and the use of nanocrystals. Floating gate memory devices comprising thin films have a multilayer structure, such as a Si—$SiO_2$—SiN—$SiO_2$—Si (SONOS) structure or a metal-SiN—$SiO_2$—Si structure. SONOS is now at the stage of practical application, but has a shortcoming in that the number of electron traps is small, leading to a reduction in the memory window width. For this reason, methods for inserting nanocrystals into high-dielectric-constant materials have been studied. With respect to this, studies on the use of silicon (Si) nanocrystals, germanium (Ge) nanocrystals, and tantalum nitride (TaN) nanocrystals have mainly been conducted (N. Takahashi et al., "Control of coulomb blockade oscillations in silicon single electron transistor using silicon nanocrystal floating gates," Appl. Phys. Lett., 2000, 76, 209; M. Kanoun et al., "Electrical study of Ge-nanocrystal based metal-oxide semiconductor structures for p-type nonvolatile memory applications," Appl. Phys. Lett., 2004, 84, 5079; A. Choi et al., "Highly thermally stable TiN nanocrystals as charge trapping sites for nonvolatile memory device applications," Appl. Phys. Lett., 2005, 86, 123110). Recently, there have been reports of methods for inserting an Al metal into an $Al_2O_3$ film, and methods for inserting Ge crystals into an $HfO_2$ film (S, Nakata et al., "Nonvolatile memory using $Al_2O_3$ film with an embedded Al-rich layer," Appl. Phys. Lett., 2005, 87, 223110; S. Wang et al., "Investigation of Ge nanocrystals in a metal-insulator semiconductor structure with a $HfO_2/SiO_2$ stack as the tunnel dielectric," Appl. Phys. Lett., 2005, 86, 113105). However, such methods employing nanocrystals have a problem in that nanocrystals, which play an important role in device characteristics, are difficult to form with uniform size and density over a large area. For this reason, floating gate memory devices comprising $Al_2O_3$ or Al-rich $Al_2O_3$ and floating gate memory devices comprising AlN or Al-rich AlN have been studied, and have been reported to have a high memory window compared to that of SONOS, and a low operating voltage compared to that of floating gate memory devices comprising nanocrystals.

Prior methods for making floating gates can be divided into physical vapor deposition and chemical vapor deposition, such as metal organic chemical vapor deposition (MOCVD) and atomic layer deposition (ALD). In the physical vapor deposition, the surface of a grown thin film is rough, and it is not easy to grow a uniform thin film on a large-area substrate or a three-dimensional substrate, and it is more difficult to form a thin film than when using the chemical vapor deposition. Conversely, in the chemical vapor deposition, the roughness of a thin film is better, and it is easy to form a relatively uniform film on a large-area substrate, compared to the physical vapor deposition. In particular, the ALD adapted in the present invention is a method of depositing a thin film by alternately supplying a metal source and an oxygen source, in which, because a process can be carried out at lower temperature than MOCVD, a high-quality film can be deposited on a low-melting-point substrate such as glass, and it is very easy to control the thickness, even in the case of very thin films, and the surface roughness of a thin film is very small. Also, the ALD has advantages in that a thin film having uniform thickness can be formed either on a large-area substrate having a uniform composition or on a three-dimensional substrate having trenches or holes, and it is easy to dope different metals in desired amounts.

Meanwhile, a method of preparing aluminum oxide through the ALD method is a method of depositing a thin film by alternately supplying an aluminum source and an oxygen source. As aluminum sources, aluminum trichloride ($AlCl_3$), trimethyl aluminum ($Me_3Al$), triethyl aluminum ($Et_3Al$), chlorodimethyl aluminum ($Me_2AlCl$), aluminum ethoxide [$Al(OEt)_3$], and aluminum isopropoxide [$Al(OiPr)_3$], etc., have been reported [M. Leskela and M. Ritala, "ALD precursor chemistry: Evolution and future challenges," J. Phys. IV 1999, 9, Pr8-837-Pr8-852].

Also, examples of a simple application of the ALD method for the deposition of a nickel oxide layer have recently been reported in several studies (M. Utriainen et al., "Studies of NiO thin film formation by atomic layer epitaxy," Mater. Sci. Eng. B, 1998, 54, 98-103]; M. Utriainen et al., "Studies of metallic thin film growth in an atomic layer epitaxy reactor using $M(acac)_2$ (M=Ni, Cu, Pt) precursors," Appl. Surf. Sci., 2000, 157, 151-158). Nickel compounds known to be used in the prior ALD methods include several β-diketonate and β-ketoiminate compounds, such as ($NiCl_2$), $Ni(acac)_2$ (acac=acetylacetonato), $Ni(tmhd)_2$ (tmhd=2,2,6,6-tetramethyl-3,5-heptanedionato), $Ni(dmg)_2$ (dmg=dimethylglyoximato), and $Ni(apo)_2$ (apo=2-aminopent-2-en-4-onato) (M. Utriainen et al., "Studies of NiO thin film formation by atomic layer epitaxy," Mater. Sci. Eng. B, 1998, 54, 98-103; M. Utriainen et al., "Studies of metallic thin film growth in an atomic layer epitaxy reactor using $M(acac)_2$ (M=Ni, Cu, Pt) precursors," Appl. Surf. Sci., 2000, 157, 151-158).

Meanwhile, the present inventors previously filed an invention relating to nickel aminoalkoxide compounds, represented by $Ni[OCR^1R^2(CH_2)_mNR^3R^4]_2$ and useful as precursors for forming nickel oxide layers (Korean Patent Application No. 2003-0069585).

However, there is, so far, no example in which the NiO thin film grown using the ALD method is applied to non-volatile floating gate memory devices.

SUMMARY OF THE INVENTION

Therefore, it is an object of the present invention to provide a method for depositing a nanolaminate film of first high-dielectric-constant layer/nickel oxide layer/second high-dielectric-constant layer for non-volatile floating gate memory devices using the advantages of atomic layer deposition (ALD).

Another object of the present invention is to provide a non-volatile floating gate memory device comprising said nanolaminate film of first high-dielectric-constant layer/nickel oxide layer/second high-dielectric-constant layer.

The present inventors have made many efforts to achieve the above objects and, as a result, were able to depositing a nanolaminate film of first high-dielectric-constant layer/nickel oxide layer/second high-dielectric-constant layer for non-volatile floating gate memory devices through a method comprising forming a first high-dielectric-constant layer on a substrate using the ALD method, alternately supplying a nickel source and an oxygen source on the first high-dielectric-constant layer using the ALD method so as to form a nickel oxide layer, which can be controlled to a given thickness, and then forming on the nickel oxide layer a second-high-dielectric-constant layer using the ALD method, and found that the nanolaminate film of first high-dielectric-constant layer/nickel oxide layer/second high-dielectric-constant layer, deposited using said method, shows good memory window (threshold voltage) characteristics when it is applied to non-volatile floating gate memory devices, thereby completing the present invention.

Accordingly, the present invention relates to a method of depositing a nanolaminate film of first high-dielectric-constant layer/nickel oxide layer/second high-dielectric-constant layer, which is to be used in non-volatile floating gate memory devices, using atomic layer deposition (ALD), and to a non-volatile floating gate memory device comprising the same. The first high-dielectric-constant layer and the second high-dielectric-constant layer can be made of one selected from among an aluminum oxide ($Al_2O_3$) layer, a zirconium oxide ($ZrO_2$) layer and a hafnium oxide ($HfO_2$) layer. Among these oxide layers, the aluminum oxide layer is preferred.

According to one aspect of the present invention, there is provided a method for depositing a nanolaminate film of first high-dielectric-constant layer/nickel oxide layer/second high-dielectric-constant layer, the method including the steps of:

a) introducing a substrate into an atomic layer deposition reactor;

b) forming on the substrate a first high-dielectric-constant layer by alternately supplying an oxygen source and a metal source selected from among an aluminum source, a zirconium source and a hafnium source;

c) forming on the first high-dielectric-constant layer a nickel oxide layer by alternately supplying a nickel source and an oxygen source; and d) forming on the nickel oxide layer a second high-dielectric-constant layer by alternately supplying an oxygen source and a metal source selected from among an aluminum source, a zirconium source and a hafnium source.

According to another aspect of the present invention, there is provided a non-volatile memory device, including:

a semiconductor substrate;

a first high-dielectric-constant layer formed on the semiconductor substrate by atomic layer deposition;

a nickel oxide layer formed on the first high-dielectric-constant layer by atomic layer deposition;

a second high-dielectric constant layer deposited on the nickel oxide layer by atomic layer deposition; and an electrode formed on the second high-dielectric constant layer.

BRIEF DESCRIPTION OF THE DRAWINGS

The above and other objects, features and advantages of the present invention will be more clearly understood from the following detailed description, taken in conjunction with the accompanying drawings, in which.

DETAILED DESCRIPTION OF THE INVENTION

Figure 1:
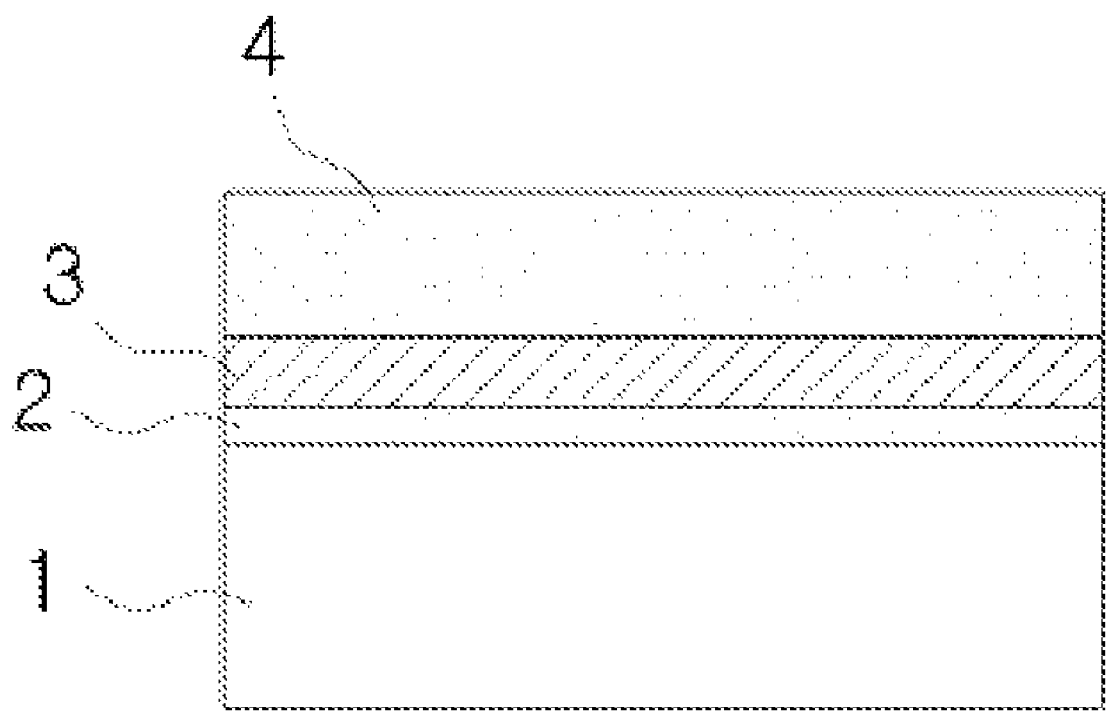
FIG. 1 is a schematic diagram of an $Al_2O_3/NiO/Al_2O_3$ nanolaminate film according to the present invention.

Hereinafter, the present invention will be described in detail.

The inventive method for depositing a nanolaminate film having a structure of first high-dielectric-constant layer/nickel oxide layer/second high-dielectric-constant layer comprises the steps of:

a) placing a substrate in an atomic layer deposition reactor;

b) forming on the substrate a first high-dielectric-constant layer by alternately supplying an oxygen source and a metal source selected from among an aluminum source, a zirconium source and a hafnium source;

c) forming on the first high-dielectric-constant layer a nickel oxide layer by alternately supplying a nickel source and an oxygen source; and d) forming on the nickel oxide layer a second high-dielectric-constant layer by alternately supplying an oxygen source and a metal source selected from among an aluminum source, a zirconium source and a hafnium source.

The first high-dielectric-constant layer and the second high-dielectric-constant layer preferably have a dielectric constant of about 5, and more preferably at least about 10, and can be selected from among an aluminum oxide ($Al_2O_3$) layer, a zirconium oxide ($ZrO_2$) layer and a hafnium oxide ($HfO_2$) layer. Among these oxide layers, the aluminum oxide layer is preferred due to its excellent thermal stability.

The steps b) to d) are carried out using the atomic layer deposition method of alternately supplying the metal source and the oxygen source to form a metal oxide layer. In these steps, the metal source and the oxygen source are alternately supplied to the substrate, which is maintained at a constant temperature, so that they become adsorbed on the substrate, and between these steps, either the reactor is vented or an inert gas such as argon is allowed to flow to the reactor to remove unreacted residue or byproducts, thereby depositing a thin film on the substrate. More specifically, each of the steps b) to d) can consist of the following steps (1) to (4). The steps (1) to (4) form one cycle, and a thin film having a desired thickness can be formed by repeating the cycle.

(1) a step of supplying the metal source into the atomic layer deposition reactor to adsorb the metal source on the substrate;

(2) a first purge step of removing any unreacted metal source and reaction byproducts from the atomic layer deposition reactor;

(3) a step of supplying the oxygen source into the atomic layer deposition reactor to adsorb oxygen chemical species on the substrate having metal chemical species adsorbed thereon, thus oxidizing the metal chemical species; and (4) a second purge step of removing any unreacted oxygen source and reaction byproducts from the atomic layer deposition reactor.

In the step b), the metal source selected from among an aluminum source, a zirconium source and a hafnium source is used, and the atomic layer deposition process consisting of the steps (1) to (4) is carried out one or more times using the metal source, so as to form the first high-dielectric-constant layer having a desired thickness. Then, in the step c), the atomic layer deposition process consisting of the steps (1) to (4) is carried out one or more times using the nickel source so as to form the nickel oxide layer having a given thickness. Thereafter, in the step d), the second high-dielectric-constant layer is formed using the metal source, selected from among an aluminum source, a zirconium source and a hafnium source, instead of the nickel source, thereby forming a nanolaminate film of first high-dielectric-constant layer/nickel oxide layer/second high-dielectric-constant layer, having a desired thickness.

The inventive method for depositing the nanolaminate film may further comprise, after the step d), a step of thermally treating the substrate at a temperature of 400-1000° C. The thermal treatment is carried out in order to remove impurities from the nanolaminate film and stabilize the device characteristics of the nanolaminate film. If the thermal treatment temperature is lower than 400° C., the effects of removing impurities and stabilizing the device characteristics will be insufficient, and if the thermal treatment temperature is higher than 1000° C., the device characteristics may be deteriorated.

Also, as a pretreatment process before the substrate is introduced into the atomic layer deposition reactor, a washing process of removing any oxide layer existing on the substrate may also be carried out. If a silicon substrate is used, it is cleaned with an HF-containing washing solution to remove a silicon oxide layer.

Examples of substrates that can be used in the step a) include a silicon (Si) wafer, a germanium (Ge) wafer, a silicon carbide (SiC) wafer, a glass substrate and a metal substrate, as well as those in which a metal, such as platinum (Pt), iridium (Ir), gold (Au) or ruthenium (Ru), or metal oxide such as indium tin oxide (ITO) or ruthenium dioxide ($RuO_2$), is deposited on said substrates. The temperature of the substrate is maintained at 90-200° C., and more preferably 90-150° C., in which case a nanolaminate film of first high-dielectric-constant layer/nickel oxide layer/second high-electric-constant layer, having better characteristics, can be formed. The reason why it is preferred that the substrate be maintained in the above-specified temperature range is that the temperature range in which atomic layer deposition occurs is between 90° C. and 200° C., and no atomic layer deposition occurs at higher temperatures or lower than this temperature range.

As the aluminum source that is used to deposit the high-dielectric-constant layers in the steps b) and d), trimethyl aluminum is preferably used, but one compound selected from among compounds generally used in the art, including triethyl aluminum ($Et_3Al$), chlorodimethyl aluminum ($Me_2AlCl$), aluminum ethoxide [$Al(OEt)_3$] and aluminum isopropoxide, may also be used. As the zirconium source, zirconium butoxide [$Zr(O^tBu)_4$], diethylamido zirconium [$Zr(NEt)_4$] or ethylmethylamido zirconium ($ZrN(MeEt)_4$] may be used, and as the hafnium source, hafnium butoxide [$Hf(O^tBu)_4$], diethylamido hafnium [$Hf(NEt)_4$] or ethylmethylamido hafnium [$HfN(MeEt)_4$] may be used, but the scope of the present invention is not limited thereto.

As the oxygen source, water, oxygen ($O_2$), ozone, or oxygen plasma, may be used.

As the nickel source that is used to deposit the nickel oxide layer in the step c), one compound selected from among conventional nickel sources, including nickel chloride ($NiCl_2$), $Ni(acac)_2$ (acac=acetylacetonato), $Ni(tmhd)_2$ (tmhd=2,2,6,6-tetramethyl-3,5-heptanedioato), $Ni(dmg)_2$ (dmg=dimethylglyoximato) and $Ni(apo)_2$ (apo=2-aminopent-2-en-4-onato), may be used. However, it is preferable to use nickel aminoalkoxide, represented by Formula 1 below:

[Formula 1]

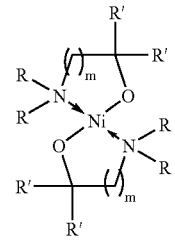

wherein m is an integer ranging from 1 to 3, and R and R', which may be the same or different, represent linear or branched-chain $C_1$-$C_4$ alkyl groups. Preferably, m is 1 or 2.

In the atomic layer deposition process of forming the nickel oxide layer using the nickel aminoalkoxide of Formula 1, the temperature of the nickel source that is supplied to the atomic layer deposition process is preferably in the range from room temperature to 80° C.

FIG. 1 is a schematic diagram showing an $Al_2O_3$/NiO/$Al_2O_3$ nanolaminate film according to one embodiment of the present invention. As shown in FIG. 1, a first $Al_2O_3$ layer 2 is formed on a silicon substrate 1 by atomic layer deposition, and then a nickel oxide (NiO) layer 3 is deposited to a thickness of 1-10 nm on the first $Al_2O_3$ layer 2 by atomic layer deposition. Then, a second $Al_2O_3$ layer 4 is formed to a thickness of 10-40 nm on the nickel oxide layer 3 by atomic layer deposition. Although the thickness of each layer of the nanolaminate film does not need to be limited, the nanolaminate film exhibits good memory window characteristics in the above-specified thickness range when it is applied to a nonvolatile floating gate memory cell.

In another aspect, the present invention provides a nonvolatile floating gate memory device, comprising: a semiconductor substrate; a first high-dielectric-constant layer formed on the semiconductor substrate by atomic layer deposition; a nickel oxide layer formed on the first high-dielectric-constant layer by atomic layer deposition; a second high-dielectric-constant layer formed on the nickel oxide layer by atomic layer deposition; and an electrode formed on the second high-dielectric-constant layer.

The first high-dielectric-constant layer is a tunnel layer, serving as a passage through which electrons migrate, the nickel oxide layer is a trap layer, serving as a floating gate which holds or releases electrons depending on input voltage, and the second high-dielectric-constant layer is a control oxide layer, serving to transfer voltage, applied to the electrode formed on the second high-dielectric-constant layer, to the trap layer.

The non-volatile floating gate memory device according to the present invention has a structure of substrate/first high-dielectric-constant layer/nickel oxide/second high-dielectric-constant layer/electrode. The first high-dielectric-constant layer and the second high-dielectric-constant layer preferably consist of an aluminum oxide layer, a zirconium oxide layer or a hafnium oxide layer. Among these oxide layers, the aluminum oxide layer is more preferably used due to its excellent thermal stability. The nanolaminate film is deposited according to the above-described deposition method. The electrode formed on the nanolaminate film is made of one selected from among poly-silicon (Si), aluminum (Al), platinum (Pt), iridium (Ir), ruthenium (Ru), nickel silicide ($Ni_2Si$), indium tin oxide (ITO), and ruthenium oxide ($RuO_2$). The formation of the electrode is performed according to any conventional method known in the art, for example, a sputtering method, which uses a mask for electrodes.

Figure 2:
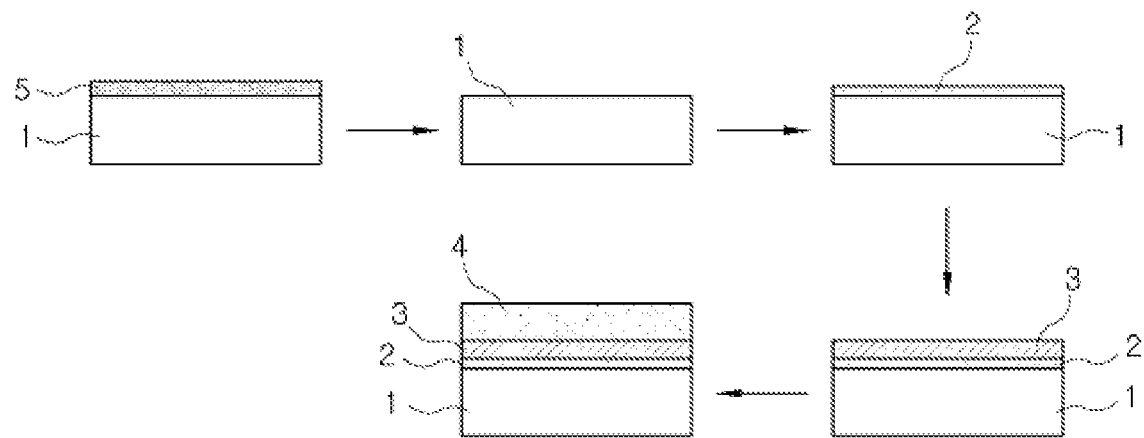
FIG. 2 is a schematic diagram showing a process of depositing the $Al_2O_3/NiO/Al_2O_3$ nanolaminate film according to the present invention.
Figure 3:
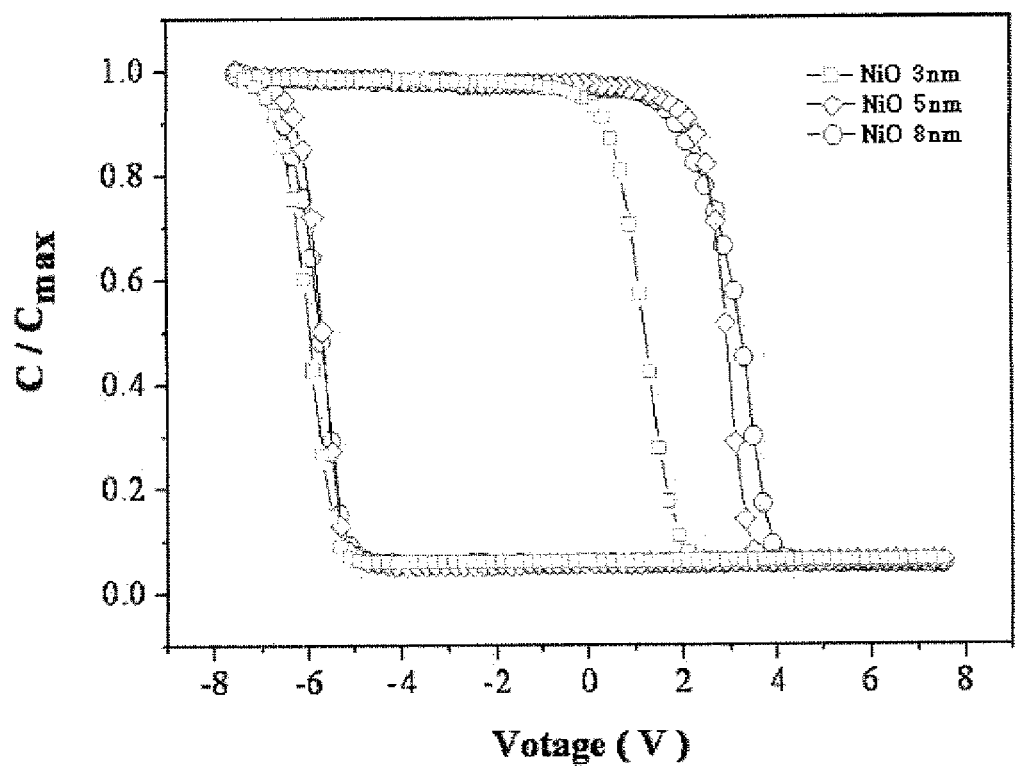
FIG. 3 shows memory window (threshold voltage) values at various NiO thicknesses in the $Al_2O_3/NiO/Al_2O_3$ nanolaminate film according to the present invention.

FIG. 3 shows memory window (threshold voltage shift) values at varying NiO thicknesses of 3 nm, 5 nm and 8 nm in non-volatile floating gate memory devices, which have the structure shown in FIG. 1 and are deposited by forming $Al_2O_3$ (5 nm)/NiO (3-8 nm)/$Al_2O_3$ (20 nm) on the respective silicon substrates using the method of FIG. 2. As can be seen in FIG. 3, the memory window of the non-volatile floating gate memory device is large, even when the NiO thickness thereof is 3 nm. Also, there is little or no difference in memory window between NiO thicknesses of 5 nm and 8 nm, even though the memory window becomes larger with an increase in NiO thickness. For this reason, it is considered suitable for the thickness of NiO to be less than 8 nm, and in order for the nanolaminate film to exhibit memory window characteristics, such that it can be applied to floating memory devices, the NiO thickness is preferably 1-8 nm, and more preferably 3-8 nm.

Figure 4:
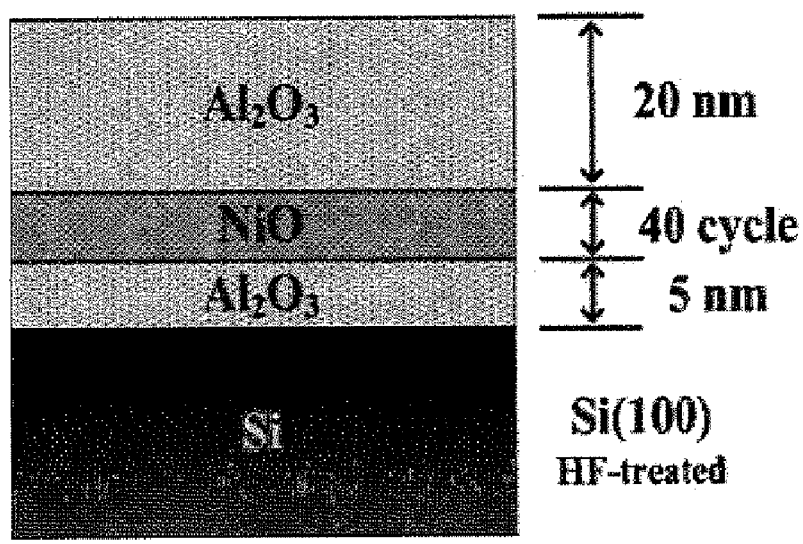
FIG. 4 shows memory window (threshold voltage) values at various sweep voltages in the $Al_2O_3/NiO/Al_2O_3$ nanolaminate film according to the present invention.
Figure 4:
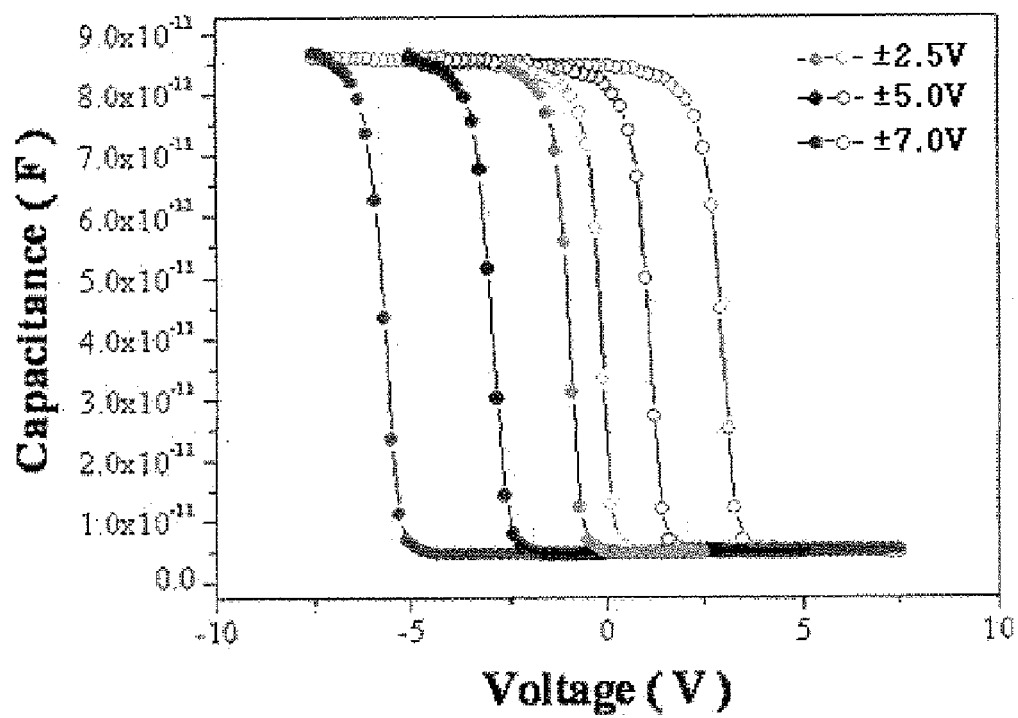

FIG. 4 shows memory window (threshold voltage shift) values at varying sweep voltages of ±2.5 V, ±5.0 V and ±7.0 V in a non-volatile floating memory device comprising $Al_2O_3$ (5 nm)/NiO (40 cycles, 5 nm)/$Al_2O_3$ (20 nm). As can be seen in FIG. 4, the memory window of the non-volatile floating memory device becomes larger with an increase in sweep voltage.

From the results in FIGS. 3 and 4, it can be seen that the nanolaminate film according to the present invention has good memory window characteristics, such that it can be applied to non-volatile floating gate memory devices.

Hereinafter, the present invention will be described in further detail with reference to examples. It is to be understood, however, that these examples are illustrative only, and the scope of the present invention is not limited thereto.

Example 1

FIG. 2 is a schematic diagram showing a process of depositing an $Al_2O_3$/NiO/$Al_2O_3$ nanolaminate film according to the present invention. The nanolaminate film was deposited using the process sequence shown in FIG. 2.

Specifically, a silicon substrate to be deposited with an $Al_2O_3$/NiO/$Al_2O_3$ film was washed sequentially with acetone, ethanol and deionized water, and then cleaned with an HF-containing cleaning solution to remove native oxides from the surface of the silicon substrate, followed by washing with deionized water. Then, the silicon substrate was placed in an atomic layer deposition reactor, which was vented with an evacuation pump, and the temperature of the substrate was controlled to 120° C.

Then, an $Al_2O_3$ layer was formed on the silicon substrate using trimethyl aluminum and water. Herein, the aluminum source and water were maintained at room temperature, and the formation of the $Al_2O_3$ layer was carried out in the following conditions: flow rate of purge gas argon: 100 sccm; purge time: 40 sec; aluminum source supply time: 0.2 sec; water supply time: 0.5 sec; and working pressure of reactor: 3 Torr. The above process was repeated for 50 cycles to form a 5 nm thick $Al_2O_3$ layer.

Thereafter, the temperature of a container containing, as a nickel source, nickel aminoalkoxide, synthesized according to the method described in Korean Patent Application No. 2003-69585, was elevated to 80° C. When the valve of a nickel source supply tube, controlled to 80° C., was opened, the vapor pressure of the supply tube could be maintained constant. As an oxygen source, water was used.

An atomic layer deposition reaction was carried out using the nickel source, while the temperatures of the nickel source supply tube and the nickel source container were maintained constant at 80° C., and the temperature of the substrate was maintained constant at 120C. Herein, the atomic layer deposition reaction was carried out under the following conditions: flow rate of purge gas argon: 100 sccm; purge time: 40 sec; nickel source supply time: 4 sec; water supply time: 1 sec; and working pressure of reactor: 5 Torr. The process was repeated for 40 cycles to form a 5 nm thick NiO layer.

Then, a 20 nm think $Al_2O_3$ layer was formed on the NiO layer using trimethyl aluminum and water. Herein, the temperatures of the aluminum source and water were maintained constant at room temperature, and the temperature of the substrate was maintained constant at 120° C. Also, the following process conditions were used: flow rate of purge gas argon: 100 sccm; purge time: 40; aluminum source supply time: 0.2 sec; water supply time: 0.5 sec; and working pressure of reactor: 3 Torr. The process was repeated for 200 cycles to form a 20 nm thick $Al_2O_3$ layer.

Example 2

$Al_2O_3$/NiO/$Al_2O_3$ nanolaminate films were deposited in the same conditions as in Example 1, except that the thickness of the NiO layer was changed to 3 nm, 5 nm and 8 nm. Then, a 300-μm thick Al electrode was formed on each of the nanolaminate films. Memory window (threshold voltage shift) values at the NiO thicknesses were measured, and the measurement results are shown in FIG. 3. As can be seen from the results in FIG. 3, the memory window of the non-volatile floating gate memory device was large, even when the NiO thickness thereof was 3 nm. Also, there was little or no difference in memory window between NiO thicknesses of 5 nm and 8 nm, even though the memory window became larger with an increase in NiO thickness.

Example 3

An $Al_2O_3$/NiO/$Al_2O_3$ nanolaminate film deposited under the same conditions as in Example 1 was measured for memory window (threshold voltage shift) at varying sweep voltages, and the measurement results are shown in FIG. 4. As can be seen from the results in FIG. 4, the memory window became larger as the sweep voltage increased from ±2.5 V to ±5.0 V and ±7.0V.

From the results in FIGS. 3 and 4, it can be seen that the nanolaminate film according to the present invention has good memory window characteristics, such that it can be applied to non-volatile floating gate memory devices.

As described above, the inventive method of depositing a nanolaminate film of first high-dielectric-constant layer/nickel oxide layer/second high-dielectric-constant layer by atomic layer deposition has advantages in that it can be carried out at a lower temperature than the prior physical deposition method, and it is very easy to control thickness, even in the case of very thin films. Also, it is possible to form a thin film either on a large-area substrate having a uniform composition or on a three-dimensional substrate having trenches or holes. In addition, the nanolaminate film of first high-dielectric-constant layer/nickel oxide layer/second high-dielectric-constant layer, deposited according to the present invention, shows good window memory characteristics, and thus can be applied to non-volatile floating gate memory devices.

Although the preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method for depositing a nanolaminate film for non-volatile floating gate memory devices, the method comprising the steps of:
    a) introducing a substrate into an atomic layer deposition reactor;
    b) forming on the substrate a first high-dielectric-constant layer by alternately supplying an oxygen source and a metal source selected from among an aluminum source, a zirconium source and a hafnium source;
    c) forming on the first high-dielectric-constant layer a nickel oxide layer by alternately supplying a nickel source and an oxygen source wherein the nickel source is one compound selected from the group consisting of nickel chloride ($NiCl_2$), $Ni(acac)_2$ (acac=acetylacetonato), $Ni(tmhd)_2$ (tmhd=2,2,6,6-tetramethyl-3,5-heptanedioato), $Ni(dmg)_2$ (dmg=dimethylglyoximato), $Ni(apo)_2$ (apo=2-amino-Dent-2-en-4-onato) and nickel aminoalkoxide, represented by Formula 1

[Formula 1]

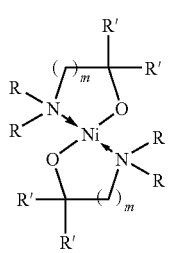

[Formula 1]

wherein m is an integer ranging from 1 to 3, and R and R', which may be the same or different, represent a linear or branched-chain $C_1$-$C_4$ alkyl group; and
    d) forming on the nickel oxide layer a second high-dielectric-constant layer by alternately supplying an oxygen source and a metal source selected from among an aluminum source, a zirconium source and a hafnium source.

2. The method of claim 1, wherein the first high-dielectric-constant layer and the second high-dielectric-constant layer consist of an aluminum oxide layer.

3. The method of claim 1, wherein m in Formula 1 is 1 or 2.

4. The method of claim 1, wherein the oxygen source is water, oxygen, ozone, or oxygen plasma.

5. The method of claim 1, wherein the substrate is maintained at a temperature of 90-200° C.

6. The method of claim 1, further comprising, after the step d), a step of thermally treating the substrate at a temperature of 400-1000° C.

7. A non-volatile floating gate memory device, comprising:
    a semiconductor substrate;
    a first high-dielectric-constant layer formed on the semiconductor substrate by atomic layer deposition;
    a nickel oxide layer formed on the first high-dielectric-constant layer by atomic layer deposition wherein the nickel oxide layer is formed by alternately su in an oxygen source and a nickel source selected from the group consisting of nickel chloride ($NiCl_2$), $Ni(acac)_2$ (acac=acetylacetonato), $Ni(tmhd)_2$ (tmhd=2,2,6,6-tetramethyl-3,5-heptanedioato), $Ni(dmg)_2$ (dmg=dimethylglyoximato), $Ni(apo)_2$ (apo=2-aminopent-2-en-4-onato) and nickel aminoalkoxide, represented by Formula 1

[Formula 1]

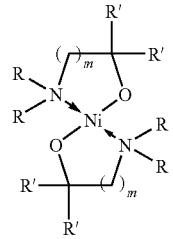

[Formula 1]

wherein m is an integer ranging from 1 to 3, and R and R', which may be the same or different, represent a linear or branched-chain $C_1$-$C_4$ alkyl group;
    a second high-dielectric-constant layer formed on the nickel oxide layer by atomic deposition layer and
    an electrode formed on the second high-dielectric-constant layer.

8. The non-volatile floating gate memory device of claim 7, wherein the first high-dielectric-constant layer and the second high-dielectric-constant layer consist of one selected from among an aluminum oxide layer, a zirconium oxide layer and a hafnium oxide layer.

9. The non-volatile floating gate memory device of claim 8, wherein the first high-dielectric-constant layer and the second high-dielectric-constant layer consist of the aluminum oxide layer.

10. The non-volatile floating gate memory device of claim 7, wherein the electrode is made of one selected from among poly-silicon (Si), aluminum (Al), platinum (Pt), iridium (Ir), ruthenium (Ru), nickel silicide ($Ni_2Si$), indium tin oxide (ITO), and ruthenium oxide ($RuO_2$).

11. The method of claim 1, wherein the nickel source for forming the nickel oxide layer is nickel aminoalkoxide, represented by Formula 1

[Formula 1]

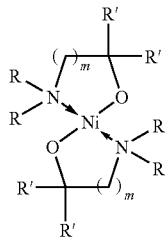

wherein m is an integer ranging from 1 to 3, and R and R', which may be the same or different, represent a linear or branched-chain $C_1$-$C_4$ alkyl group.

12. The method of claim 11, wherein m in Formula 1 is 1 or 2.

13. The non-volatile floating gate memory device of claim 7, wherein the nickel source for forming the nickel oxide layer is nickel aminoalkoxide, represented by Formula 1

[Formula 1]

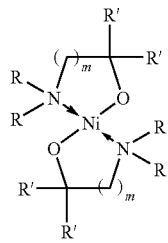

wherein m is an integer ranging from 1 to 3, and R and R', which may be the same or different, represent a linear or branched-chain $C_1$-$C_4$ alkyl group.

14. The non-volatile floating gate memory device of claim 7, wherein m in Formula 1 is 1 or 2.

15. The non-volatile floating gate memory device of claim 13, wherein m in Formula 1 is 1 or 2.

* * * * *